United States Patent
Nagata

(10) Patent No.: US 10,649,592 B2
(45) Date of Patent: May 12, 2020

(54) CONDUCTIVE SUBSTRATE AND METHOD FOR FABRICATING CONDUCTIVE SUBSTRATE

(71) Applicant: SUMITOMO METAL MINING CO., LTD., Tokyo (JP)

(72) Inventor: Junichi Nagata, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 72 days.

(21) Appl. No.: 15/738,293

(22) PCT Filed: Jun. 23, 2016

(86) PCT No.: PCT/JP2016/068608
§ 371 (c)(1),
(2) Date: Dec. 20, 2017

(87) PCT Pub. No.: WO2016/208654
PCT Pub. Date: Dec. 29, 2016

(65) Prior Publication Data
US 2018/0181232 A1 Jun. 28, 2018

(30) Foreign Application Priority Data

Jun. 26, 2015 (JP) .................................. 2015-129123

(51) Int. Cl.
*G06F 3/044* (2006.01)
*H05K 1/02* (2006.01)
(Continued)

(52) U.S. Cl.
CPC .............. *G06F 3/044* (2013.01); *B32B 15/08* (2013.01); *H05K 1/0274* (2013.01); *H05K 3/06* (2013.01);
(Continued)

(58) Field of Classification Search
CPC ..................... B32B 15/08; G06F 3/044; G06F 2203/04112; G06F 2203/04103;
(Continued)

(56) References Cited

U.S. PATENT DOCUMENTS

| 7,534,500 | B2 | 5/2009 | Kobayashi et al. | |
| 2014/0251429 | A1 | 9/2014 | Lim et al. | |
| 2015/0205326 | A1* | 7/2015 | Lim ........................ | B32B 15/04 345/174 |
| 2016/0202507 | A1* | 7/2016 | Ebisui ..................... | B43L 1/008 345/174 |

(Continued)

FOREIGN PATENT DOCUMENTS

| CN | 102321832 | 1/2012 |
| EP | 1096845 | 5/2001 |

(Continued)

OTHER PUBLICATIONS

International Search Report dated Aug. 9, 2016 with respect to PCT/JP2016/068608.
Informal Comments for PCT/JP2016/068608 dated Dec. 2, 2016.

*Primary Examiner* — Vinh T Lam
(74) *Attorney, Agent, or Firm* — IPUSA, PLLC

(57) ABSTRACT

A laminated substrate is provided that includes a transparent base material, and a laminated body formed at least one surface of the transparent base material. The laminated body includes a blackened layer containing oxygen, copper, and nickel, and a copper layer. A ratio of the nickel is 11 mass % or more and 60 mass % or less, among the copper and the nickel contained in the blackened layer.

6 Claims, 5 Drawing Sheets

(51) Int. Cl.
   *H05K 3/06* (2006.01)
   *H05K 3/16* (2006.01)
   *B32B 15/08* (2006.01)
   *C23C 14/14* (2006.01)
   *C23F 1/02* (2006.01)

(52) U.S. Cl.
   CPC .............. *H05K 3/16* (2013.01); *C23C 14/14* (2013.01); *C23F 1/02* (2013.01); *G06F 2203/04103* (2013.01); *G06F 2203/04112* (2013.01); *H05K 2201/2054* (2013.01); *H05K 2203/085* (2013.01)

(58) Field of Classification Search
   CPC .......... H05K 3/16; H05K 3/06; H05K 1/0274; H05K 2201/2054; H05K 2203/085; H05K 1/02; C23C 14/14; C23F 1/02
   See application file for complete search history.

(56) References Cited

U.S. PATENT DOCUMENTS

2016/0209441 A1* 7/2016 Mazzeo ................. G01P 15/125
2016/0212836 A1* 7/2016 Arai ........................... C22C 9/05
2016/0357047 A1* 12/2016 Yu ....................... G02F 1/13338

FOREIGN PATENT DOCUMENTS

| JP | 2001-127485 | 5/2001 |
| JP | 2003-151358 | 5/2003 |
| JP | 2005-268688 | 9/2005 |
| JP | 2008-300393 | 12/2008 |
| JP | 2011-018194 | 1/2011 |
| JP | 2013-069261 | 4/2013 |
| JP | 2013-129183 | 7/2013 |
| JP | 2015-503182 | 1/2015 |
| JP | 2015-069440 | 4/2015 |

* cited by examiner

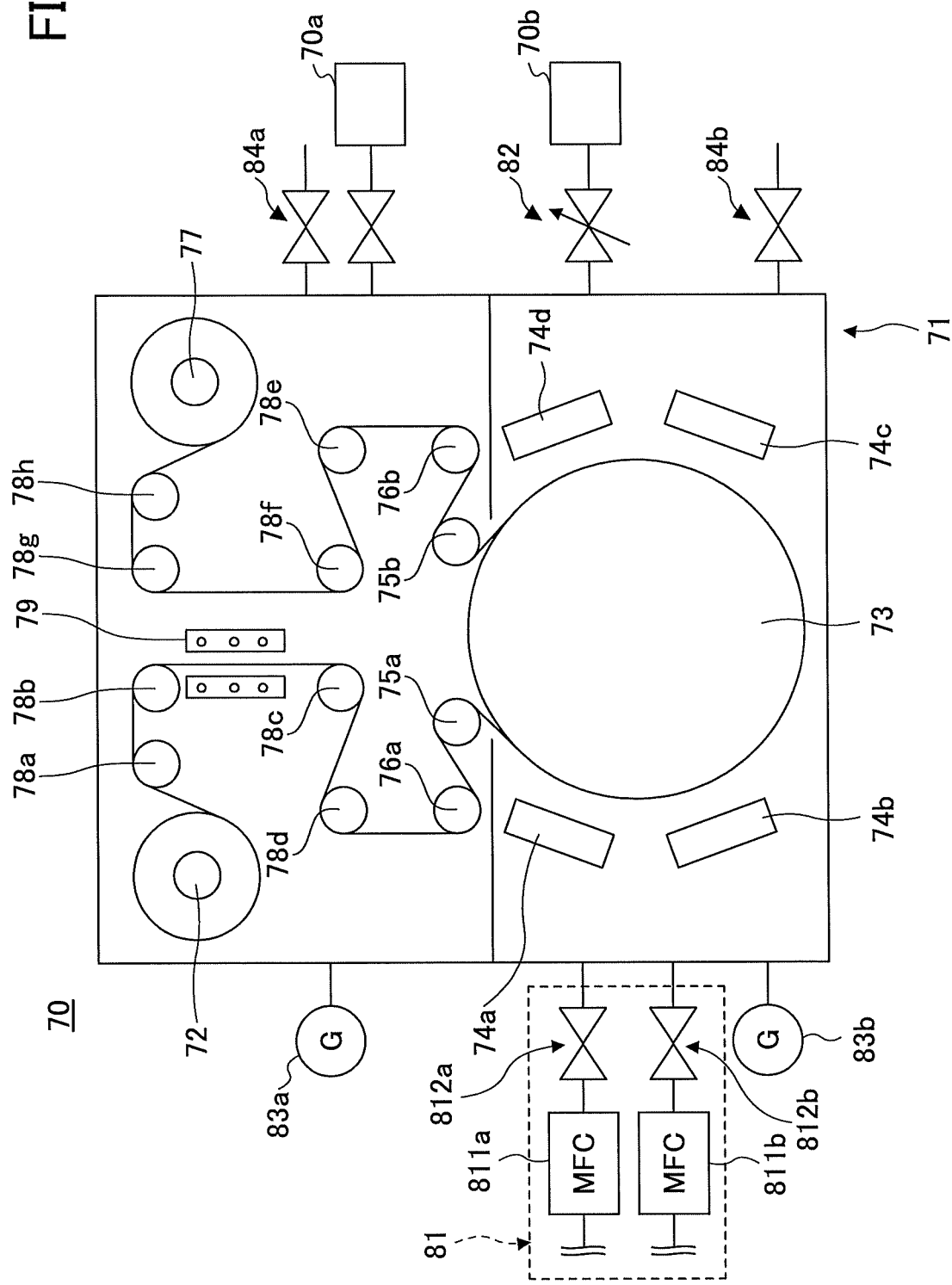

CONDUCTIVE SUBSTRATE AND METHOD FOR FABRICATING CONDUCTIVE SUBSTRATE

TECHNICAL FIELD

The present invention relates to a laminated substrate, a conductive substrate, a method for fabricating a laminated substrate, and a method for fabricating a conductive substrate.

BACKGROUND ART

As disclosed in Patent Document 1, a transparent conductive film for a touch panel, in which an indium tin oxide (ITO) film is formed on a surface of a transparent base material such as the transparent polymer film as the transparent conductive film, has been conventionally used.

In recent years, a size of a screen for a display including the touch panel has been increased. In response to an increase of the size of the screen, a wider dimension is desired for the conductive substrate such as the transparent conductive film for the touch panel. However, since the ITO has a high electric resistance value, there is a problem in which it is difficult to correspond to the wider dimension of the conductive substrate.

Therefore, for example, instead of ITO film electrodes as disclosed in Patent Documents 1 and 2, it has been considered to use metal electrodes such as copper or the like. However, for example, in a case of using copper to the metal electrodes, there is a problem that visibility of a display is degraded due to reflection, since copper has a metallic luster.

Hence, a conductive substrate in which a blackened layer composed of a black material is formed on a surface parallel to a surface of a transparent base material of metal electrodes with metal electrodes such as copper has been considered.

PRIOR ART DOCUMENTS

Patent Documents

Patent Document 1: Japanese Laid-open Patent Publication No. 2003-151358
Patent Document 2: Japanese Laid-open Patent Publication No. 2011-018194
Patent Document 3: Japanese Laid-open Patent Publication No. 2013-069261

SUMMARY OF THE INVENTION

Problem to be Solved by the Invention

A conductive substrate including metal electrodes on a transparent base material is acquired by etching a metal layer so as to be a desired electrode pattern and forming metal electrodes after a laminated substrate is acquired in which the metal layer is formed on a surface of the transparent base material. Also, the conductive substrate including a blackened layer and the metal electrodes on a transparent base material is acquired by etching the blackened layer and the metal layer so as to be the desired electrode pattern and forming the metal wiring.

By etching the blackened layer and the metal layer, for example, as illustrated in FIG. 1A, a conductive substrate is formed by laminating a patterned blackened layer 2 and a metal electrode 3 where the metal layer is patterned on a transparent base material 1. In this case, a width $W_A$ of the blackened layer 2 and a width $W_B$ of the metal electrode 3 can substantially correspond to each other.

However, there is a problem in which reactivity to an etchant is greatly different between the metal layer and the blackened layer. That is, in a case of attempting to simultaneously etch the metal layer and the blackened layer, either one layer is not etched in a target shape as depicted in FIG. 1A.

For example, compared with the metal layer, when an etching speed of the blackened layer is significantly slow, a side surface of the metal electrode 3 being the patterned metal layer is etched as depicted FIG. 1B. That is, a side etching occurs. Accordingly, a cross-sectional shape of the metal electrode 3 tends to be a trapezoidal shape extending toward the transparent base material 1. If etching is conducted until an electric insulating performance between the metal wirings 3 is ensured, an electrode pitch width becomes too wide.

Moreover, compared with the metal layer, when the etching speed of the blackened layer is significantly high, the width (bottom width) $W_A$ of the patterned blackened layer 2 becomes shorter than the width $W_B$ of the metal electrode 3; that is, an undercut occurs as depicted FIG. 1C. Such the undercut occurs, and depending on a degree of the undercut, the bottom width $W_A$ of the patterned blackened layer 2, which is an adhesive width to the transparent base material 1, becomes smaller than the width $W_B$ of the metal electrode 3. There is a problem in which when an adhesive width ratio drops more than necessary, electrode adhesion strength is not sufficiently acquired.

Also, in a case of performing separate steps for the etching of the metal layer and the etching of the blackened layer, instead of simultaneously etching the metal layer and the blackened layer, disadvantageously, a step number is increased.

In view of the above problems of the conventional technologies, it is an object of the present invention to provide a laminated substrate including a copper layer and a blackened layer and possible for a simultaneous etching process to be conducted.

Means for Solving the Problem

To solve the above problems, the present invention provides a laminated substrate including
a transparent base material; and
a laminated body formed on at least one surface of the transparent base material,
wherein the laminated body includes
a blackened layer containing oxygen, copper, and nickel; and
a copper layer, and
a ratio of the nickel is 11 mass % or more and 60 mass % or less, among the copper and the nickel contained in the blackened layer.

Advantageous Effects of the Invention

According to the present invention, it is possible to provide a laminated substrate including a copper layer and a blackened layer and possible for a simultaneous etching process to be conducted.

BRIEF DESCRIPTION OF THE DRAWINGS

FIG. 7 is a diagram for explaining a roll-to-roll sputtering apparatus according to the embodiment of the present invention.

EMBODIMENT FOR IMPLEMENTING THE INVENTION

Figure 1A:
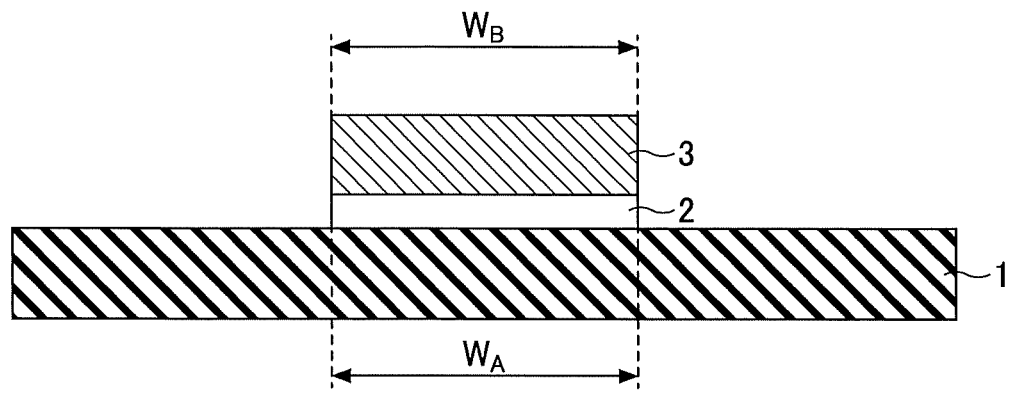
FIG. 1A is a diagram for explaining a case of simultaneously etching a metal layer and a blackened layer with respect to a conductive substrate in a related art.
Figure 1B:
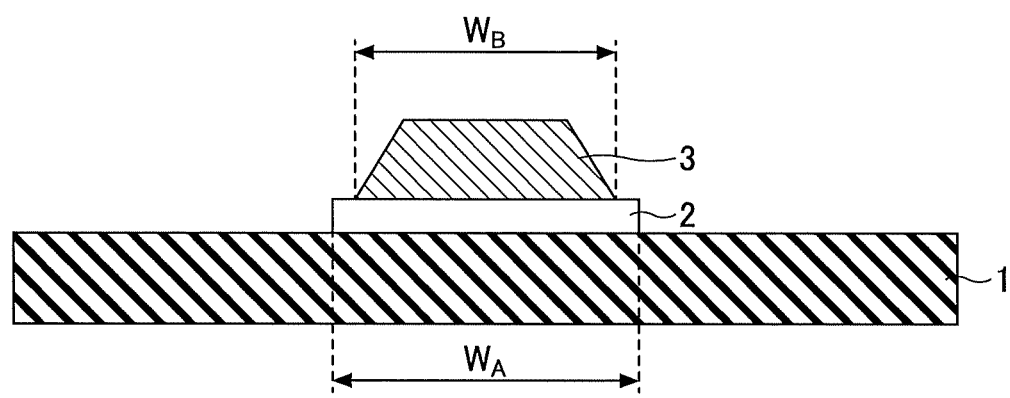
FIG. 1B is a diagram for explaining the case of simultaneously etching the metal layer and the blackened layer with respect to the conductive substrate in the related art.
Figure 1C:
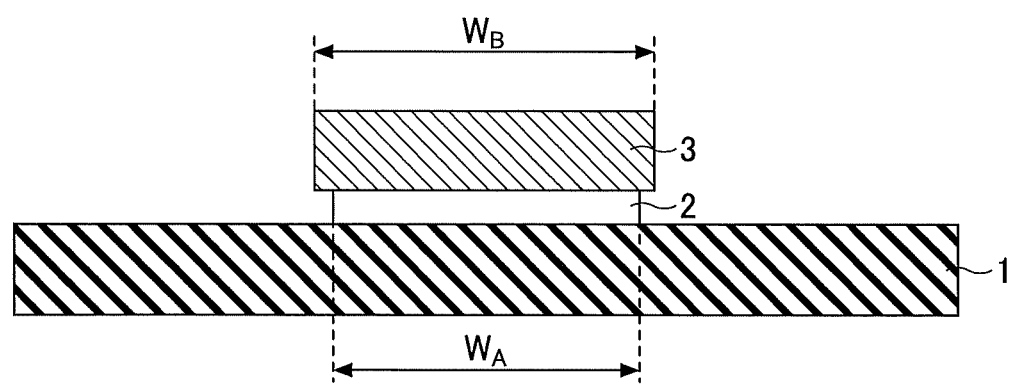
FIG. 1C is a diagram for explaining the case of simultaneously etching the metal layer and the blackened layer with respect to the conductive substrate in the related art.

In the following, embodiments of a laminated substrate, a conductive substrate, a method for fabricating a laminated substrate, and a method for fabricating a conductive substrate will be described.

(Laminated Substrate and Conductive Substrate)

A laminated substrate of an embodiment may include a transparent base material and a laminated body formed on at least one of laterals of the transparent base material. Also, the laminated body may include the blackened layer containing oxygen, copper, and nickel, and a copper layer, in which among the copper and the nickel contained in the blackened layer, a ratio of the nickel can be 11 mass % or more and 60 mass % or less.

It should be noted that the laminated substrate in the embodiment is regarded as a substrate including, on the surface of the transparent base material, the copper layer or the blackened layer before a patterning. Also, the conductive substrate is regarded as an electrode substrate including, on the surface of the transparent base material, a copper electrode layer and/or a blackened layer formed in an electrode shape by the patterning.

First, each of members included in the laminated substrate of the embodiment will be described below.

The transparent base material is not particularly limited, and a polymer film transmitting visible light, a glass substrate, or the like can be used.

For example, as the polymer film transmitting the visible light, a resin film can be used such as a polyamide-based film, a polyethylene terephthalate-based film, a polyethylene naphthalate type film, a cycloolefin type film, a polyimide type film, a polycarbonate type film, or the like.

The thickness of the transparent base material is not particularly limited, and any thickness may be optionally selected depending on strength, a transmittance, and the like required to form the conductive substrate. For example, 10 µm or more and 250 µm may be desirable as the thickness of the transparent base material. Especially, in a case of using the transparent base material for an application of a touch panel, 20 µm or more and 200 µmm may be desirable, and 20 µm or more and 120 µm may be more desirable. In a case of using the transparent base material for the application of the touch panel, for example, especially for an application in which thinning of the entire display is required, the thickness of the transparent base material is preferably 20 µm or more and 100 µm or less.

Next, the laminated body will be described. The laminated body is formed on one of the laterals of the transparent base material, and may include the blackened layer and the copper layer.

First, the copper layer will be described.

The copper layer is also not particularly limited; however, in order to reduce light transmittance, preferably, an adhesive is not deployed between the copper layer and the transparent base material, or between the copper layer and the blackened layer. That is, preferably, the copper layer is directly formed on an upper surface of another member.

In order to directly form the copper layer on the upper surface of another member, a copper film layer is formed by using a dry plating method such as a sputtering method, an ion plating method or an evaporation method, so that it is possible to form the copper film layer as the copper layer.

In a case of forming the copper layer to be thicker, preferably, a wet type plating may be used after the copper film layer is formed by a dry plating method. That is, for example, the copper film layer may be formed by the dry plating method on the transparent member or the blackened layer. The copper film layer is formed as a power supply layer and a copper plating layer may be formed by the dry plating method. In this case, the copper layer includes the copper film layer and the copper plating layer.

By forming the copper layer by the dry plating method or by combining the dry plating method and the wet plating method, preferably, the copper layer is formed without deploying the adhesive on the transparent base material or the blackened layer.

The thickness of the copper layer is not particularly limited, and may be optionally selected depending on an electric resistance value and an electrode width of the electrode in a case of using the copper layer as the wiring. Especially, the thickness of the copper layer is desirable to be 50 nm or more, is more desirable to be 60 nm or more, and is further more desirable to be 150 nm or more, in order for electricity to sufficiently flow. An upper limit of the thickness of the copper layer is not particularly limited; however, if the copper layer becomes thicker, a side etching occurs since more time is spent for etching to form the wiring, and thus, a problem such as separation of a resist in a middle of the etching is likely caused. Therefore, the thickness of the copper layer is desirable to be 5000 nm or less, and is more desirable to be 3000 nm or less. It should be noted that in a case in which the copper layer includes the copper film layer and the copper plating layer as described above, it is desirable for a total thickness of the copper film layer and the copper plating layer to fall in the above described range.

Next, the blackened layer will be described.

Since the copper layer has metallic luster, in a case of forming the copper film layer being the electrode alone, to which the copper layer is etched on the transparent base material, the copper layer reflects light as described above, and for example, in a case of using as the electrode substrate for the touch panel, there is a problem in which visibility of the display deteriorates. Hence, a method for providing the blackened layer has been considered; however, there is a case in which the blackened layer does not have sufficiently reactivity to an etching solution, and thus, it has been difficult to simultaneously etch the copper layer and the blackened layer in a desired shape.

Contrary, the blackened layer deployed on the laminated substrate of the embodiment contains oxygen, copper, and nickel. Therefore, there is barely difference of the reactivity to the etching solution between the blackened layer deployed on the laminated substrate of the embodiment and the copper layer, and the reactivity of the blackened layer is desirable. Accordingly, for the laminated substrate of the embodiment, the copper layer and the blackened layer containing the oxygen, copper, and nickel can be simultaneously etched.

The simultaneous etching of the blackened layer deployed on the laminated substrate of the embodiment and the copper layer will be described below.

The inventors of the present invention initially examined a method for forming a layer of copper oxide where a part of the copper layer is oxidized as the blackened layer capable of suppressing reflection of light on a surface of the copper layer. Then, the inventors found that there is a case in which the blackened layer contains non-stoichiometric copper oxide and unoxidized copper in a case of oxidize a part of the copper layer to form the blacked layer.

In a case of simultaneously etching the copper layer and the blackened layer of the laminated substrate including the copper layer and the blackened layer, as the etching solution, for example, an etching solution capable of etching the copper can be preferably used. Moreover, according to studies of the inventors of the present invention, if the blackened layer contains the non-stoichiometric copper oxide, the blackened layer tends to be eluted into the etching solution capable of etching the copper layer.

As described above, in a case of containing the non-stoichiometric copper oxide in which the blackened layer tends to be eluted into the etching solution, the blackened layer has high reactivity to the etching solution, and compared with the copper layer, the etching speed for the blackened layer is greatly increased. Therefore, if a simultaneous etching process is conducted for the copper layer and the blackened layer, the undercut of the blackened layer tends to occur.

Therefore, in the laminated substrate of the embodiment, in order to suppress the undercut, the blackened layer can include a nickel component difficult to dissolve with the etching solution in addition to oxygen and copper. Since the blackened layer of the laminated substrate of the embodiment contains oxygen, copper, and nickel, the reactivity to the etching solution can correspond to that of the copper layer; hence, it becomes possible to simultaneously etch the blackened layer and the copper layer.

The ratio of the nickel is not particularly limited among copper and nickel contained in the blackened layer; however, it is desirable for the ratio of nickel to be 11 mass % or more and 60 mass % or less among copper and nickel contained in the blackened layer. It should be noted that the ratio of nickel indicates a ratio in a case in which a total content of copper and nickel included in the blackened layer is 100 mass %.

This is because the undercut is likely to occur when the ratio of nickel is 11 mass % or less among copper and nickel contained in the blackened layer. That is, a dissolution rate to the etching solution of the blackened layer is faster than that of the copper layer, and this blackened layer is not a blackened layer capable of being etched simultaneously with the copper layer.

However, if nickel is mixed with the ratio exceeding 60 mass % among copper and nickel contained in the blackened layer, it becomes difficult to etch the blackened layer due to excessive nickel. That is, the dissolution rate of the blackened layer to the etching solution is slower than that of the copper, and this blackened layer is not the blackened layer capable of being etched simultaneously with the copper layer.

Also, since the ratio of nickel is 11 mass % or more and 60 mass % or less among copper and nickel contained in the blackened layer, it is possible for an average of a regular reflectance of light having wavelengths of the laminated substrate and the conductive substrate formed from the laminated substrate, which are 400 nm or more and 700 nm or less to be 55% or less. Therefore, even in a case of using such the conductive substrate for applications of the touch panel and the like, since reduction in visibility of the display can be suppressed, the embodiment is desirable from this point of view.

Moreover, in the laminated substrate, the blackened layer and the copper layer can be laminated on the transparent base material as described later, and it is possible to acquire the conductive substrate by patterning this blackened layer and the copper layer. In a case in which the ratio of nickel exceeds 60 mass % among copper and nickel contained in the blackened layer, when an opening portion is formed by etching the blackened layer and the copper layer, the blackened layer and the copper layer cannot be sufficiently removed, and the surface of the transparent base material seems to turn yellow. For this reason, the ratio of nickel is preferable to be 60 mass % or less among copper and nickel contained in the blackened layer as described above.

The blackened layer can contain copper and nickel as metal species, and the metal species contained in the blackened layer can be composed of copper and nickel alone; however, the metal species are not limited to copper and nickel alone. For example, the blackened layer may further contain unavoidable impurities of 1 mass % or less as the metal species.

Also, the blackened layer may oxygen, copper, and nickel, and it is not particularly limited what state each of components is contained in. For example, at least a part of copper or nickel may be oxidized, may form non-stoichiometric copper oxide or nickel oxide, and may be contained in the blackened layer.

Since the blackened layer of the laminated substrate of the embodiment contains nickel, even if the blackened layer contains non-stoichiometric copper oxide, it is possible for the reactivity to the etching solution to be approximately the same as the copper layer. Therefore, in the laminated substrate of the embodiment, the copper layer and the blackened layer can be simultaneously etched.

It should be noted that an amount of oxygen contained in the blackened layer is not particularly limited. The amount of oxygen contained in the blackened layer affects light reflectance of the laminated substrate or the conductive substrate fabricated by using the laminated substrate. Therefore, it is preferable to select the amount of oxygen to be contained in the blackened layer and furthermore select the amount of oxygen added to form the blackened layer, depending on a degree of the light reflectance required for the laminated substrate or the conductive substrate fabricated by using the laminated substrate, color tone of the blackened layer.

A copper electrode layer and a blackened electrode layer of the conductive substrate acquired from the laminated substrate of the embodiment retains features of the copper layer and the blackened layer of the embodiment, respectively.

A film forming method of the blackened layer deployed on the conductive substrate of the embodiment is not particularly limited. For example, it is preferable to form the blackened layer by a dry film formation method such as a sputtering method or the like.

In a case of forming the blackened layer by the sputtering method, for example, a film can be formed by using a copper-nickel alloy target while supplying oxygen gas in addition to inert gas used as sputtering gas inside a chamber.

In a case of using the copper-nickel alloy target at time of the sputtering, the ratio of nickel is preferably to be 11 mass % or more and 60 mass % or less among copper and nickel contained in a copper-nickel alloy. This is because a ratio of nickel among copper and nickel contained in the blackened layer to be formed becomes the same as a ratio of nickel of the target of the copper-nickel alloy used to form the blackened layer among copper and nickel contained in the copper-nickel alloy.

In a case of forming the blackened layer by the sputtering method, a method for adjusting a supply amount of the oxygen gas to be supplied into the chamber is not particularly limited. For example, a mixed gas, in which the oxygen gas and the inert gas are mixed beforehand such that oxygen partial pressure becomes a desired partial pressure, can be used. Also, the inert gas and the oxygen gas are simultaneously supplied into the chamber, and a partial pressure of the oxygen gas inside the chamber can be adjusted. Especially, the latter is preferable because the partial pressure of each of gases in the chamber can be adjusted as required.

It is noted that the inert gas for forming the blackened layer is not particularly limited; for example, an argon gas or a xenon gas can be used, however, the argon gas can be suitably used. Moreover, the blackened layer can also contain one or more components selected from hydrogen and carbon in addition to oxygen as a component other than the metal component. Therefore, the gas for forming the blackened layer may contain one or more kinds of gases selected from water vapor, a carbon monoxide gas, a carbon dioxide gas in addition to the oxygen gas and the inert gas.

As described above, in a case of forming blackened layer by the sputtering method while supplying the inert gas and the oxygen gas into the chamber, ratios of the inert gas and the oxygen gas to be supplied into the chamber are not limited. The ratios may be optionally selected depending on the light reflection required for the laminated substrate and the conductive substrate, a degree of color tone, and the like.

The thickness of the blackened layer formed on the laminated substrate of the embodiment is not particularly limited; for example, the thickness of the blackened layer may be optionally selected depending on a degree of suppressing the light reflection on the surface of the copper layer.

Regarding the thickness of the blackened layer, for example, a lower limit is preferably to be 10 nm or more, and is further preferably to be 15 nm or more. For example, an upper limit is preferably to be 70 nm or less, and is further preferably to be 50 nm or less.

As described above, the blackened layer functions as a layer for suppressing the light reflection on the surface of the copper layer; however, in a case in that the thickness of the blackened layer is thin, the light reflection due to the copper layer may not be sufficiently suppressed. On the contrary, in a case of forming the thickness of the blackened layer to be 10 nm or more, it is possible to suppress light reflection more reliably.

The upper limit of the thickness of the blackened layer is not particularly limited; however, if the blackened layer is formed thicker than necessary, time for forming the blackened layer and time for etching to form the electrode are prolonged, and thus, cost is increased. For this reason, the thickness of the blackened layer is preferable to be 70 nm or less, is further preferable to be 50 nm.

Next, a configuration example of the laminated substrate of the embodiment will be described.

As described above, the laminated substrate of the embodiment can include the transparent base material, and the laminated body including the copper layer and the blackened layer. In this configuration, an order of deploying the copper layer and the blackened layer in the laminated body onto the transparent base material, and a number of layers are not particularly limited. That is, for example, it is possible to laminate the copper layer and the blackened layer one by one in arbitrary order on at least one of the side surfaces of the transparent base material. Also, a plurality of layers can be formed in the laminated body by the copper layer and/or the blackened layer.

When the copper layer and the blackened layer are deployed in the laminated body, in order to suppress the light reflection on the surface of the copper layer, it is preferable to arrange the blackened layer on a particular surface, for which the light reflection is suppressed, among surfaces of the copper layer.

Especially, it is further preferable for the laminated body to have a laminated structure in which the blackened layer is formed on the surface of the copper layer; in particular, for example, it is preferable for the laminated body to include two layers as the blackened layers, a first blackened layer and a second blackened layer, and for the copper layer to be deployed between the first blackened layer and the second blackened layer.

Details of a configuration example will be described with reference to FIG. 2A, FIG. 2B, FIG. 3A, and FIG. 3B. FIG. 2A, FIG. 2B, FIG. 3A, and FIG. 3B illustrates examples of cross-sectional views in planes parallel to a direction of laminating the laminated substrate of the embodiment, the transparent base material, the copper layer, and the blackened layer.

Figure 2A:
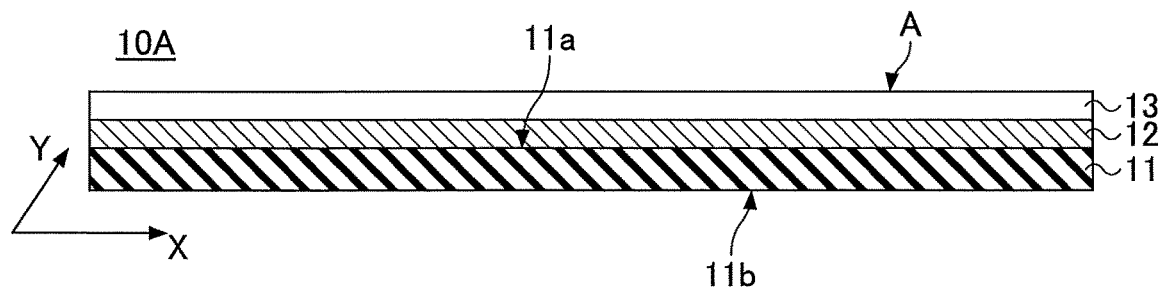
FIG. 2A illustrates a cross-sectional view of a laminated substrate according to an embodiment of the present invention.

For example, such as a conductive substrate 10A depicted in FIG. 2A, a copper layer 12 and a blackened layer 13 may be stacked one by one in this order on one surface 11a of the transparent base material 11. Moreover, such as a conductive substrate 10B depicted in FIG. 2B, at the one surface 11a and another surface (an opposite surface) 11b, copper layers 12A and 12B, and the blackened layers 13A and 13B can be stacked respectively one by one in this order. It should be noted that an order of stacking copper layers 12 (12A and 12B) and blackened layers 13 (13A and 13B) is not limited to the examples in FIG. 2A and FIG. 2B, and the blackened layers 13 (13A and 13B) and the copper layers 12 (12A and 12B) can be stacked in this order from the transparent base material 11.

Moreover, as described above, for example, a configuration can be formed with multiple blackened layers stacked on one side of the transparent base material 11. For example, such as a conductive substrate 20A depicted in FIG. 3A, a first blackened layer 131, a copper layer 12, and a second blackened layer 132 can be stacked on one surface 11a of the transparent base material 11 in this order.

As described above, as the blackened layer, by including the first blackened layer 131 and the second blackened layer 132 and arranging the copper layer 12 between the first blackened layer 131 and the second blackened layer 132, it is possible to suppress the reflection of incident light from an top side and a bottom side of the copper layer 12 more reliably.

In this case, also, the copper layer, the first blackened layer, and the second blackened layer can be stacked on both sides of the transparent base material 11. In particular, such as a conductive substrate 20B depicted in FIG. 3B, first blackened layers 131A and 131B, copper layers 12A and 12B, and second blackened layers 132A and 132B can be stacked on each of one surface 11a and another surface (an opposite surface) 11b of the transparent base material 11 in this order.

It should be noted that first blackened layers 131 (131A and 131B) and second blackened layers 132 (132A and 132B) can be formed as blackened layers containing oxygen, copper, and nickel, and can be fabricated by the same fabricating method.

Figure 2B:
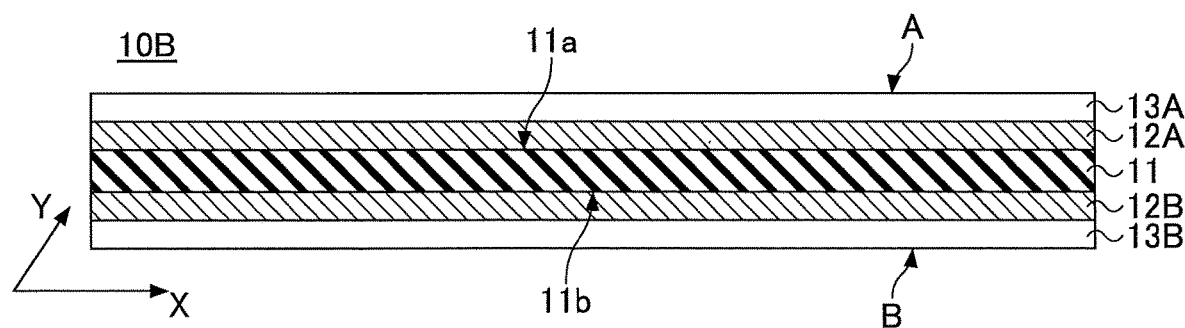
FIG. 2B illustrates a cross-sectional view of the laminated substrate according to the embodiment of the present invention.
Figure 3A:
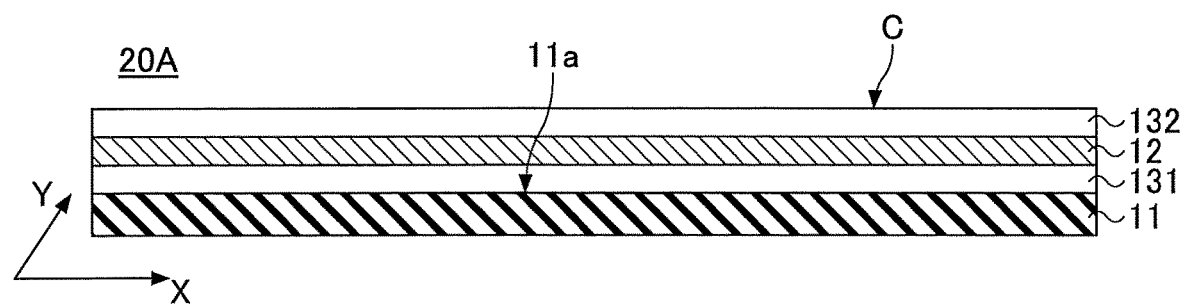
FIG. 3A illustrates a cross-sectional view of the laminated substrate according to the embodiment of the present invention.
Figure 3B:
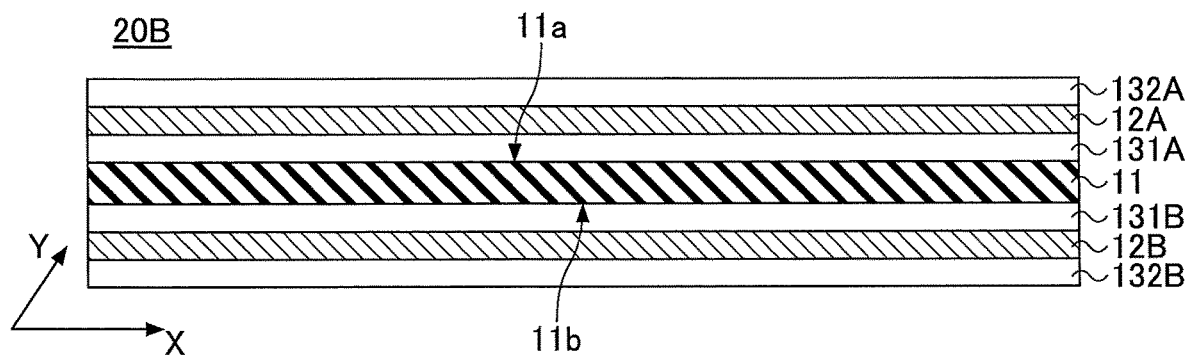
FIG. 3B illustrates a cross-sectional view of the laminated substrate according to the embodiment of the present invention.

In the configuration examples in FIG. 2B and FIG. 3B in which the copper layers and the blackened layers are stacked on both sides of the transparent base material, the transparent base material 11 is regarded as a symmetry plane, and layers arranged on and under the transparent base material 11 so as to be symmetrical; however, the embodiment is not limited to such configuration. For example, in FIG. 3B, a configuration of one surface 11a of the transparent base material 11 may be formed similar to the configuration in FIG. 2B so that the copper layers 12A and the blackened layers 13B are stacked in this order. A configuration of another surface 11b may be formed so that the first blackened layer 131B, a copper layer 12B and the second blackened layer 132B are stacked in this order. An asymmetric configuration may be formed by layers stacked on and under the transparent base material 11.

The degree of the light reflection of the laminated substrate of the embodiment is not particularly limited; however, for example, the average of the regular reflectance of light having a wavelength of 400 nm or more and 700 nm or less is preferably to be 55% or less, more preferable to be 40% or less, and further more preferable to be 30% or less. This is because in a case in which the average of the regular reflectance of light having a wavelength of 400 nm or more and 700 nm or less is less than or equal to 55%, for example, even if the laminated substrate of the present invention is used as the conductive substrate for the touch panel, it is possible to suppress, particularly, the reduction in the visibility of the display.

The regular reflectance of light of the laminated substrate can be measured by illuminating light to the blackened layer. That is, it is possible to measure the regular reflectance of light by illuminating light from the blackened layer among the copper layer and the blackened layer contained in the laminated substrate. In particular, for example, in a case in which the copper layer 12 and the blackened layer 13 are stacked in this order on one surface 11a of the transparent base material 11 as depicted in FIG. 2A, it is possible to measure the regular reflectance of light by illuminating light with respect to a surface A of the blackened layer 13 such that the light is illuminated to the blackened layer 13. Moreover, in a case of FIG. 2A and in a case of exchanging arrangements between the copper layer 12 and the blackened layer 13 and stacking the blackened layer 13 and the copper layer 12 in this order on one surface 11a of the transparent base material 11, by illuminating light to a blackened layer from the surface 11b of the transparent base material 11 so as to illuminate light to the blackened layer 13, the regular reflectance can be measured.

Moreover, the average of the regular reflectance of light having the wavelength of 400 nm or more and 700 nm or less means an average value of a measurement result when changing the wavelength within a range of 400 nm or more and 700 nm or less. In a case of measuring the regular reflectance, a range to change the wavelength is not particularly limited; for example, it is preferable to measure with respect to light of the above described wavelength range by changing the wavelength by every 10 nm, and more preferable to measure with respect to light of the above described wavelength range by changing the wavelength by every 1 nm.

It should be noted that as described above, a metal thin electrode is formed by processing electrode by etching the copper layer and the blackened layer such that the laminated substrate can be the conductive substrate. The regular reflectance of light on the conductive substrate means a regular reflectance at a surface of the blackened layer deployed on an outermost surface, to which light enters, if the transparent base material is removed.

Therefore, for the conductive substrate after an etching process is conducted, it is preferable for a measure value at a portion where the copper layer and the blackened layer are remained to satisfy the above described range.

Next, the conductive substrate of the embodiment will be described.

The conductive substrate of the embodiment may include the transparent base material and the metal thin electrode formed on at least one side of the transparent base material. The metal thin electrode is a laminated body including a blackened electrode layer, which contains oxygen, copper, and nickel, and a copper electrode layer, and the ratio of nickel can be 11 mass % or more and 60 mass % or less among copper and nickel contained in the blackened electrode layer.

For example, the conductive substrate of the embodiment can be obtained by applying an electrode process to the above described laminated substrate. In the conductive substrate of the embodiment, since the copper electrode layer and the blackened layer are arranged on the transparent base material, the light reflection due to the copper electrode layer can be suppressed. Accordingly, by arranging the blackened layer, for example, in a case of using for the touch panel or the like, the conductive substrate can have preferable visibility of the display.

For example, the conductive substrate of the embodiment can be preferably used as a conductive substrate for the touch panel. In this case, the conductive substrate may have a configuration including an electrode pattern formed by arranging an opening portion to the copper layer and the blackened layer on the above described laminated substrate. More preferably, the conductive substrate may have a configuration including a meshed electrode pattern.

Figure 4:
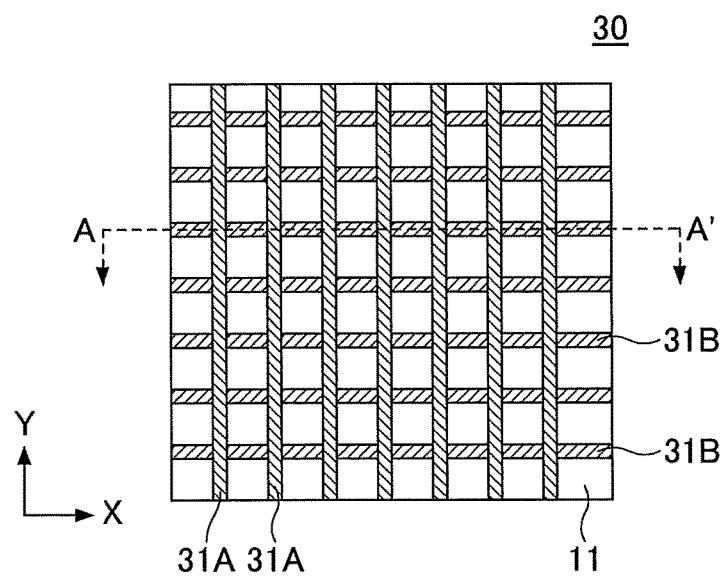
FIG. 4 is a diagram illustrating a top surface of a conductive substrate including meshed electrodes according to the embodiment of the present invention.

The conductive substrate, on which the electrode pattern having the opening portion is formed, can be obtained by etching the copper layer and the blackened layer of the laminated substrate described above. Hence, for example, the conductive substrate can be made to include the meshed electrode pattern by the metal thin electrodes of two layers. A specific configuration example will be illustrated in FIG. 4. FIG. 4 illustrates the conductive substrate 30, in which the meshed electrode pattern viewed from a top surface in the direction of laminating the copper electrode layer and the blackened wring layer. The conductive substrate 30 depicted in FIG. 4 includes the transparent base material 11, multiple copper electrode layers 31B parallel to a X-axis direction, and multiple copper electrode layers 31A parallel to a Y-axis direction in FIG. 4. It should be noted that the copper electrode layers 31A and 31B can be formed by etching the above described laminated substrate, and a blackened electrode layer, which is not depicted in FIG. 4, is formed on a top surface and/or a bottom surface of copper electrode layers 31A and 31B. Moreover, the blackened electrode layers are etched to approximately the same shape as the copper electrode layers 31A and 31B.

Figure 5:
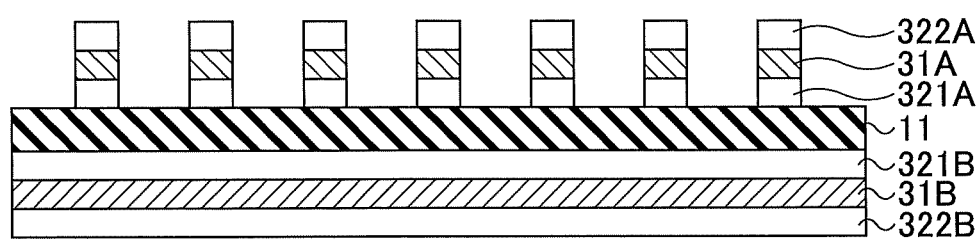
FIG. 5 illustrates a cross-sectional view at an A-A' line in FIG. 3.

Arrangements of the transparent base material 11 and the copper electrode layers 31A and 31B are not particularly limited. A configuration example of the arrangement of the transparent base material 11 and the copper electrode layer are illustrated in FIG. 5. FIG. 5 illustrates a cross-section at an A-A' line in FIG. 4.

For example, as illustrated in FIG. 5, the copper electrode layers 31A and 31B may be arranged on the top surface and the bottom surface of the transparent base material 11, respectively. It should be noted that in a case of the conductive substrate depicted in FIG. 5, on the transparent base material 11 of the copper electrode layers 31A and 31B, a first blackened electrode layers 321A and 321B, which are etched in approximately the same shape as the copper electrode layers 31A and 31B, are arranged. Moreover, on a surface opposite to the transparent base material 11 of the copper electrode layers 31A and 31B, a second blackened electrode layer 322A and 322B.

Accordingly, in the conductive substrate depicted in FIG. 5, the metal thin electrode includes the first blackened electrode layers 321A and 321B, and the second blackened electrode layer 322A and 322B, and the copper electrode layers 31A and 31B are deployed between the first blackened electrode layers 321A and 321B, and the second blackened electrode layers 322A and 322B.

It should be noted that an example, in which the first blackened electrode layers and the second blackened electrode layers are arranged, is illustrated in this figure; however, the arrangement is not limited to this example. For instance, either the first blackened electrode layers or the second blackened electrode layers may be arranged.

For example, the conductive substrate including the meshed electrode illustrated in FIG. 4 can be formed from the laminated substrate including the copper layers 12A and 12B and the blackened layers 13A and 13B (131A, 132A, 131B, and 132B) on both surfaces of the transparent base material 11, respectively.

It should be noted that for instance, the conductive substrate including the first blackened electrode layers and the second blackened electrode layers depicted in FIG. 5 can be formed from the laminated substrate illustrated in FIG. 3B.

Accordingly, an example of a case of forming the conductive substrate using the laminated substrate in FIG. 3B will be described.

First, a copper layer 12A, the first blackened layer 131A, and the second blackened layer 132A on one surface 11a of the transparent base material 11 are etched so as that a plurality linear patterns parallel to a Y-axis direction in FIG. 3B are arranged at predetermined intervals along the X-axis direction. It should be noted that the Y-axis direction in FIG. 3B indicates a direction perpendicular to a paper surface. Also, the X-axis direction in FIG. 3B indicates a direction parallel to a width direction of each layer.

Next, the copper layer 12B, the first blackened layer 131B, and the second blackened layer 132B on another surface 11B of the transparent base material 11 are etched so that a plurality of linear patterns parallel to the X-axis direction are arranged at predetermined intervals along the Y-axis direction.

By the above described operations, it is possible to form the conductive substrate including the meshed electrode depicted in FIG. 4 and FIG. 5. It should be noted that both surfaces of the transparent base material 11 can be etched at the same time. That is, the copper layers 12A and 12B, the first blackened layers 131A and 131B, and the second blackened layers 132A and 132B may be etched at the same time.

The conductive substrate including the meshed electrode depicted in FIG. 4 can be formed by using two substrates illustrated in FIG. 2A or in FIG. 3A. A case of using the conductive substrates in FIG. 2A will be described as an example. With respect to each of two conductive substrates depicted in FIG. 2A, the copper layer 12 and the blackened layer 13 are etched so that the plurality of linear patterns parallel to the X-axis direction are arranged at predetermined intervals along the Y-axis direction. Next, by bonding two conductive substrates facing each other so that the linear patterns, which are formed on each of the conductive substrates by the above described etching process, intersect each other, a conductive substrate including the meshed electrode can be formed. Respective surfaces to bond two conductive substrates are not particularly limited.

For instance, regarding two conductive substrates, by bonding surface 11b, on which the copper layer 12 and the like of the transparent base material 11 depicted in FIG. 2A are not stacked on, each other, a configuration illustrated in FIG. 5 can be formed.

It should be noted that the width of the metal thin electrodes in the conductive substrate including the meshed electrode and a distance between the metal thin electrodes depicted in FIG. 4 are not particularly limited, and for instance, may be selected depending on electric resistance values required for the metal thin electrodes and the like.

However, in order to possess sufficient adhesion between the transparent base material and the metal thin electrodes, an undercut amount ratio below is preferably to fall in a predetermined range.

Figure 6:
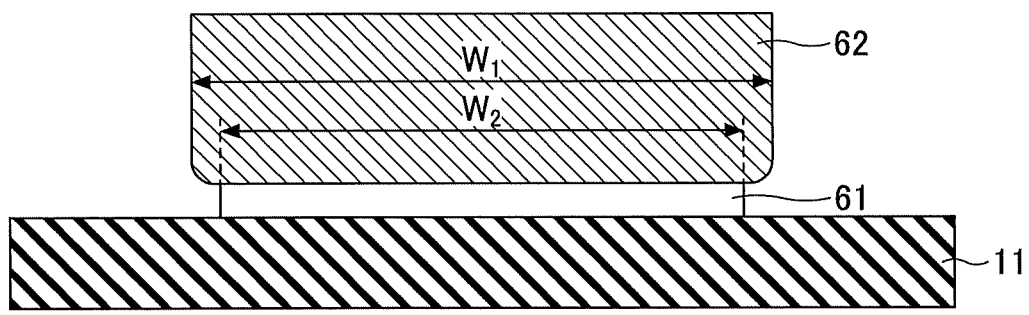
FIG. 6 is a diagram for explaining an undercut amount ratio.

Here, the undercut amount ratio will be described with reference to FIG. 6. FIG. 6 illustrates a cross-sectional view at a surface along the laminating direction of the blackened electrode layer and the copper electrode layer of the conductive substrate on which the blackened electrode layer and the copper electrode layer are stacked in this order on the transparent base material 11. It should be noted that FIG. 6 depicts an example of forming the metal thin electrode by one blackened electrode layer and the one copper electrode layer.

Among layers of forming the conductive substrate, when an etching speed of a layer contacting the transparent base material is faster than another layer formed on the top surface of the layer contacting the transparent base material, a pattern width of the layer contacting the transparent base material may be narrower than the pattern width of another layer formed on the layer contacting the transparent base material. That is, the undercut may occur.

In a configuration example depicted in FIG. 6, in a case in which the etching speed of the blackened layer contacting the transparent base material is faster than the etching speed of the copper layer formed on the top surface of the blackened layer, the undercut may occur. When the undercut may occur in the configuration example depicted in FIG. 6, a width ($W_2$) of a blackened electrode layer 61 contacting the transparent base material 11 becomes narrower than a width ($W_1$) of a copper electrode layer 62 formed on the blackened electrode layer 61, the width ($W_1$) to be the pattern width of the metal thin electrode.

In this case, the undercut amount ratio is expressed by a formula ($W_1-W_2$)/$2W_1$ using a bottom width ($W_2$) of the metal thin electrode and the pattern width ($W_1$) of the metal thin electrode.

Then, the undercut amount ratio is preferable to include a relation of ($W_1-W_2$)/$2W_1 \leq 0.075$. Since the undercut amount ratio satisfies the above relation, the blackened layer and the copper layer are simultaneously etched, a patterning is conducted in a desired pattern. From the standpoint of improving the adhesion between the transparent base material 11 and the metal thin electrode, the above undercut amount ratio is preferable.

The conductive substrate of the embodiment includes an electrode pattern formed by conducting the wiring process to the above described laminated substrate, and providing the opening portion on the copper layer and the blackened layer in the laminated substrate. Therefore, the opening portion exposing the transparent base material is provided between the metal thin electrodes included in the electrode pattern.

Moreover, a reduction rate of an average of the transmittance of light of the wavelength being 400 nm or more and 700 nm or less at the opening portion from an average of the transmittance of light at the transparent base material having a wavelength of 400 nm or more and 700 nm or less is preferable to be 3.0% or less.

In a case in which the reduction rate of an average of the transmittance of light of the wavelength being 400 nm or more and 700 nm or less at the opening portion from an average of the transmittance of light at the transparent base material having a wavelength of 400 nm or more and 700 nm or less exceeds 3.0% or less, when the transparent base material is observed with eyes, the transparent base material looks discolored to yellow. When the blackened layer and the copper layer are not significantly etched due to a slow etching speed of the blackened layer during the etching of the blackened layer and the copper layer, the above described deduction rate exceeds 3.0%. Hence, as described above, among copper and nickel contained in the blackened layer, the ratio of nickel is preferably to be 60 mass % or less.

Moreover, the degree of the light reflection of the conductive substrate of the embodiment is not particularly limited; however, for instance, the average of the light transmittance of a wavelength of 400 nm or more and 700 nm or less is preferably to be 55% or less, is more preferably to be 40%, and is further more preferably to be 30%. This is because when the average of the transmittance of light having a wavelength of 400 nm or more and 700 nm or less is 55% or less, for example, the reduction in the visibility of the display particularly can be suppressed even if the conductive substrate of the embodiment is used as a conductive substrate for the touch panel.

For instance, the conductive substrate including the meshed electrode formed by two-layer electrode in the embodiment may be preferably used as a conductive substrate for the touch panel of a projection type capacitance method.

(Method for Fabricating Laminated Substrate and Method for Fabricating Conductive Substrate)

Next, a configuration example of a method for fabricating the laminated substrate of the embodiment.

The method for fabricating the laminated substrate of the embodiment may include the following processes:

a transparent base material preparation process for preparing the transparent base material a laminated body formation process for forming a laminated body on at least one surface of the transparent base material.

Moreover, the laminated body formation process may include the following steps:

a copper layer formation step for forming the copper layer by a copper layer formation part that stacks copper a blackened layer formation step for forming the blackened layer by a blackened layer formation part that stacks the blackened layer containing oxygen, copper, and nickel.

Moreover, the blackened layer formation step is preferable to be conducted under a reduced pressure atmosphere. Also, among copper and nickel contained in the blackened layer, the ratio of nickel is preferable to be 11 mass % or more and 60 mass % or less.

In the following, the method for fabricating the laminated substrate of the embodiment will be described; however, a configuration similar to a case of the above described laminated substrate can be applied other than the following explanations, and the explanation of the similar configuration will be omitted.

As described above, in the laminated substrate of the embodiment, the laminating order for deploying the copper layer and the blackened layer on the transparent base material are not particularly limited. Also, by each of the copper layer and the blackened layer, multiple layers may be formed. Therefore, an order and a number of times of performing the copper layer formation step and the blackened layer formation step are not particularly limited; that is, the copper layer formation step and the blackened layer formation step can be performed at any number of times and at any timing according to a structure of the laminated substrate to be formed.

For instance, the process for preparing the transparent base material corresponds to a process for preparing the transparent base material formed by a polymer film, a glass substrate, or the like, which transmits visible light, and a specific operation is not particularly limited. For example, in order to serve each of latter processes or latter steps, it is possible to cut into any size or the like as required. It should be noted that a base suitably used as the polymer film transmitting the visible light is described above, and an explanation thereof will be omitted.

Next, the laminated body formation process will be described. The laminated body formation process corresponds to a process that forms a laminated body on at least one surface on the transparent base material, and includes the copper layer formation step and the blackened layer formation step. Each of the steps will be described below.

First, the copper layer formation step will be described.

In the copper layer formation step, a copper layer can be formed by the copper layer formation step that stacks copper on at least one surface of the transparent base material.

In the copper layer formation step, it is preferable to form a copper film layer by using the dry plating method. Moreover, when a copper layer is made to be thicker, after forming the copper film layer by the dry plating method, it is preferable to further form a copper plating layer by the wet plating method.

Accordingly, the copper layer formation step may further include a step for forming the copper film layer by the dry plating method, for example. Moreover, the copper layer formation step may include a step for forming the copper film layer by the dry plating method and a step for forming a copper plating layer by the wet plating method.

Accordingly, the above described copper layer formation part is not particularly limited to one formation part, and multiple formation parts may be combined.

As described above, by the dry plating method, or combining the dry plating method and the wet plating method, the copper layer can be formed on the transparent base material or the blackened layer without using the adhesive.

The dry plating method is not particularly limited, the ion plating method, or the evaporation method can be preferably used under the reduced pressure atmosphere.

Especially, as the dry plating method used to form the copper film layer, since a thickness control is easy, it is preferable to use the sputtering method. That is, in this case, as the copper layer formation part that stacks copper in the copper layer formation step, a sputtering formation part (sputtering formation method) can be preferably used.

For example, the copper film layer can be suitably formed by using a roll-to-roll sputtering apparatus 70 illustrated in FIG. 7. In the following, a process that forms the copper film layer will be described taking a case of using the roll-to-roll sputtering apparatus as an example.

FIG. 7 illustrates a configuration example of the roll-to-roll sputtering apparatus 70. The roll-to-roll sputtering apparatus 70 includes a chassis 71, in which most of components are accommodated. A shape of the chassis 71 is depicted as a rectangular solid shape in FIG. 7; however, the shape of the chassis 71 is not particularly limited, and can be any shape depending on a device accommodated inside, an installation place, a pressure resistance performance, or the like. For example, the shape of the chassis 71 may be cylindrical. Since residual gas not related to a film formation is removed at a start of the film formation, an inside of the chassis 71, it is preferable for the inside of the chassis 71 to be reduced to 1 Pa or less, more preferable to be reduced to $10^{-3}$ Pa, and further more preferable to be reduced to $10^{-4}$ Pa. It is should be noted that it is unnecessary to reduce the entire inside of the chassis 71 to the above described pressure; that is, it is also possible to reduce pressure to the above described pressure only for a lower region in FIG. 7 where a can roll 73, which will be described later, is arranged.

In the chassis 71, an unwinding roll 72 that supplies a substrate onto form the copper film layer, the can roll 73, sputtering cathodes 74a through 74d, a front feed roll 75a, a rear feed roll 75b, tension rolls 76a and 76b, and a winding roll 77 can be arranged. Moreover, on a conveying path of a base material on which the copper film layer is formed, guide rolls 78a through 78h, a heater 79, and the like can be arranged other than the above described rolls.

In the unwinding roll 72, the can roll 73, the front feed roll 75a, and the winding roll 77, it is possible to provide power by a servomotor. In the unwinding roll 72 and the winding roll 77, a tension balance of the base material on which the copper film layer is formed is maintained by torque control.

A configuration of the can roll 73 is not particularly limited; for example, a surface of the can roll 73 is finished by hard chromium plating, and the refrigerant and hot medium supplied from an outside of the chassis 71 are circulated in an inside of the can roll 73 so as to adjust temperature to a constant.

For example, it is preferable for surface of tension rolls 76a and 76b to be finished by a hard chrome plating, and each of the tension rolls 76a and 76b include a tension sensor. Moreover, it is preferable for surfaces of the front feed roll 75a, the rear feed roll 75b, and the guide rolls 78a through 78h to be finished by the hard chrome plating.

The sputtering cathodes 74a through 74d are preferably a magnetron cathode type and arranged facing towards the can roll 73. Sizes of the sputtering cathodes 74a through 74d are not particularly limited; however, dimensions in a width direction of a substrate, on which the copper film layers of sputtering cathodes 74a through 74d are formed, are preferably to be wider than a width of an opposite substrate on which the copper film layer is formed.

The substrate, on which the copper film layer is formed, is conveyed through the roll-to-roll sputtering apparatus 70 being a roll-to-roll vacuum deposition apparatus, and the copper film layer is formed by the sputtering cathodes 74a through 74d facing to the can roll 73.

A procedure in a case of forming the copper film layer using the roll-to-roll sputtering apparatus 70 will be described.

First, a copper target is attached on the sputtering cathodes 74a through 74d, and the inside of the chassis 71, in which a substrate, on which the copper film layer is formed, is set to the unwinding roll 72, is evacuated by vacuum pumps 70a and 70b.

Subsequently, the inert gas, for example, sputtering gas of argon or the like, is introduced in the chassis 71 by a gas supply part 81. It should be noted that a configuration of the gas supply part 81 is not particularly limited; however, the gas supply part 81 may include a gas storage tank. Therefore, by providing mass flow controllers 811a and 811b, and valves 812a and 812b for each gas type between a gas storage tank and the chassis 71, it is possible to control a supply amount to the chassis 71 of each of gasses. Two sets of the mass flow controllers and the valves are illustrated in FIG. 7; however, the number of sets is not particularly limited. The number of sets can be selected depending on a number of the gas types to be used.

When supplying the sputtering gas to the chassis 71 by the gas supply part 81, it is preferable to adjust a flow amount of the sputtering gas and an opening degree of a pressure adjustment valve provided between the vacuum pump 70b and the chassis 71, to maintain the inside of the apparatus to be 0.13 Pa or more and 1.3 Pa or less, for example, and to perform a formation.

In this state, while conveying the substrate from the unwinding roll 72 at a speed of 1 m or more 20 m or less per minute, for example, sputtering discharge is conducted by supplying power from a direct current power source for the sputtering, which is connected to the sputtering cathodes 74a through 74d. By this operation, it is possible to successively form a desired copper film layer on the substrate.

It should be noted that in addition to the above described members, various member can be arranged in the roll-to-roll sputtering apparatus 70. For example, pressure gauges 83a and 83b for measuring the pressure inside the chassis 71 and vent valves 84a and 84b may be provided.

Moreover, it is possible to form the copper layer (the copper plating layer) by using the wet plating method after the dry plating method as described above.

In a case of forming the copper plating layer by the dry plating method, the copper film layer formed by the above described dry plating can be a power supply layer. In this case, an electroplating film formation part can be preferably used as a copper layer deposition part that stacks copper in the copper layer formation step.

With the copper film layer as the power supply layer, a condition in a process that forms the copper plating layer by the dry plating method, that is, a condition of an electroplating treatment is not particularly limited, and various conditions according to ordinary methods may be adopted.

For example, the copper plating layer can be formed by supplying a base material having the copper film layer formed in a plating tank containing a copper plating solution and controlling a current density and a conveying speed of the base material.

Next, the blackened layer formation step will be described.

As described above, the blackened layer formation step is a step to form the blackened layer by the blackened layer formation part that forms the blackened layer containing oxygen, copper, and nickel on at least one surface of the transparent base material. The blackened layer formation part, which stacks the blackened layer containing the oxygen, copper, and nickel in the blackened layer formation step, is not particularly limited; for example, it is preferable for the blackened layer formation part to be the sputtering formation part under the reduced pressure atmosphere, that is, the sputtering formation method.

For example, the blackened layer may be suitably formed by using the roll-to-roll sputtering apparatus 70 illustrated in FIG. 7. The configuration of the roll-to-roll sputtering apparatus is described above, and thus, the explanation thereof will be omitted here.

A configuration example of the procedure in the case of forming the copper film layer using the roll-to-roll sputtering apparatus 70 will be described.

First, a copper-nickel alloy target is attached to the sputtering cathodes 74a through 74d, and the inside of the chassis, in which the substrate on which the blackened layer is formed is set to the unwinding roll 72, is evacuated by the vacuum pumps 70a and 70b. Subsequently, inert gas, for example, the sputtering gas formed by argon and oxygen are introduced into the chassis 71 by the gas supply part 81. In this case, it is preferable to adjust the flow amount of the sputtering gas and the opening degree of the pressure adjustment valve provided between the vacuum pump 70b and the chassis 71, to maintain the inside of the apparatus to be 0.13 Pa or more and 1.3 Pa or less, for example, and to perform the formation.

It should be noted that the inert gas and the oxygen gas may be mixed beforehand and supplied to the inside of the chassis 71; however, these gases may be separately supplied to the chassis 71, and may be adjusted in their supply amount and pressures so as to maintain each of these gases to be a desired pressure inside the chassis 71. Moreover, the sputtering gas is not particularly limited to the gas formed by the inert gas and the oxygen as described above, and may further contain one or more kinds of gases selected from water vapor, carbon monoxide gas, and carbon dioxide gas.

In this state, while conveying the substrate from the unwinding roll 72 at the speed of 0.5 m or more 10 m or less per minute, for example, sputtering discharge is conducted by supplying power from a direct current power source for the sputtering, which is connected to the sputtering cathodes 74a through 74d. By this operation, it is possible to successively form a desired blackened layer on the substrate.

In the above, each of the processes and the steps included in the method for fabricating the laminated substrate of the embodiment is described.

Similarly to the above described laminated substrate, in the laminated substrate acquired by the method for fabricating the laminated substrate of the embodiment, a thickness of the copper layer is preferably to be 50 nm or more, is more preferably to be 60 nm or more, and is further more preferably to be 150 nm. An upper limit of the thickness of the copper layer is not particularly limited; however, the thickness of the copper layer is preferably to be 5000 nm or less, and more preferably to be 3000 nm or less. It should be noted that in a case in which the copper layer includes a copper film layer and the copper plating layer as described above, a total of the thickness of the copper film layer and the thickness of the copper plaiting layer is preferably to fall in the above described range.

Moreover, the thickness of the blackened layer is not particularly limited; however, for example, the thickness of the blackened layer is preferably to be 10 nm or more, and more preferably to be 15 nm or more. The upper limit of the thickness of the blackened layer is not particularly limited; however, the thickness of the blackened layer is preferably to be 70 nm, and more preferably to be 50 nm.

Furthermore, the laminated substrate acquired by the method for fabricating the laminated substrate of the embodiment, the average of the regular reflectance of light having the wavelength of 400 nm or more and 700 nm or less is preferably to be 55% or less, more preferable to be 40% or less, and further more preferable to be 30% or less.

By using the laminated substrate acquired by the method for fabricating the laminated substrate of the embodiment, the conductive substrate, on which an electrode pattern is formed for each of the copper layer and the blackened layer to have the opening part, can be formed. More preferably, the conductive substrate can be formed to include the meshed wiring.

The method for fabricating the conductive substrate of the embodiment may include an etching process that etches the copper layer and the blackened layer of the laminated substrate acquired by the above described method for fabricating the laminated substrate, and forms an electrode pattern including the metal thin electrodes being the laminated body including the copper electrode layer and the blackened electrode layer. Accordingly, by the etching state, it is possible to form the opening parts in the copper layer and the blackened layer.

In the etching process, for example, first, a resist including the opening portion corresponding to a portion to be eliminated by etching is formed on an outermost surface of the laminated substrate. For example, in a case of the laminated substrate illustrated in FIG. 2A, it is possible to form the resist on a surface A where the copper layer 12 arranged on the laminated substrate is exposed. It should be noted that a formation method of the resist including the opening corresponding to the portion to be eliminated by etching is not particularly limited; however, the resist can be formed by a photography method, for example.

Subsequently, by supplying the etching solution from an upper surface of the resist, it is possible to conduct the etching of the copper layer 12 and the blackened layer 13.

It should be noted that in a case of arranging the copper layer and the blackened layer on both surfaces of the transparent base material 11 as illustrated in FIG. 2B, the resist including the opening portion having a predetermined shape is formed pm each of the surface A and a surface B of the laminated substrate, and the copper layer the blackened layer on the both surfaces of the transparent base material 11 are simultaneously etched. Moreover, the etching process is conducted with respect to one side respectively for the copper layer and the blackened layer formed on the both surface of the transparent base material 11. That is, for example, after the copper layer 12A and the blackened layer 13A are etched, it is possible to conduct the etching for the copper layer 12B and the blackened layer 13B.

The blackened layer formed by the method for fabricating the laminated substrate of the embodiment indicates the reactivity to the etching solution similar to the copper layer.

For this reason, the etching solution used in the etching process is not particularly limited, and generally, the etching solution used to etch the copper layer can be suitably used.

As the etching solution used in the etching process, for example, an aqueous solution containing one kind selected from sulfuric acid, hydrogen peroxide water, hydrochloric acid, cupric chloride, and ferric chloride, or a mixed aqueous solution containing two or more kinds selected from sulfuric acid and the like can be more preferably used. The content for each component in the etching solution is not particularly limited.

The etching solution can be used at room temperature; however, it is preferable to warm the etching solution in order to increase the reactivity. For instance, it is preferable to warm and use the etching solution at 40° C. or more and 50° C. or less.

A specific form of the meshed electrode acquired by the above described etching process is the same as describe above, and an explanation thereof will be omitted here.

Also, in a case in which after two laminated substrates, each of which includes the copper layer and the blackened layer on at least one surface of the transparent base material 11 depicted in FIG. 2A or FIG. 3A, are subjected to the etching process, two conductive substrates are bonded together to form one conductive substrate having the meshed wiring, a process that bonds two conductive substrate can be further provided. In this case, a method for bonding two conductive substrates is not particularly limited; however, it is possible to adhere two conductive substrate by using an Optically Clear Adhesive (OCA), for example.

It should be noted that for the conductive substrate acquired by the method for fabricating the conductive substrate of the embodiment, the average of the regular reflectance of light having the wavelength of 400 nm or more and 700 nm or less is preferably to be 55% or less, more preferable to be 40% or less, and further more preferable to be 30% or less.

In a case in which the average of the regular reflectance of light having the wavelength of 400 nm or more and 700 nm or less is preferably to be 55% or less, for example, even if the conductive substrate is used for the touch panel, it is possible to suppress, particularly, the reduction of the visibility of the display.

In the above, the laminated substrate, the conductive substrate, the method for fabricating the laminated substrate, and the method for fabricating the conductive substrate are described. According to the laminated substrate acquired by the laminated substrate or the method for fabricating the laminated substrate, the copper layer and the blackened layer show approximately the same reactivity to the etching solution. For this reason, it is possible to provide the laminated substrate including the copper layer and the blackened layer, for which the etching process can be simultaneously conducted. Since the copper layer and the blackened layer can be simultaneously etched, it is possible to easily form the copper electrode layer and the blackened electrode layer in the desired shape.

Moreover, it is possible to suppress the light reflection at the copper electrode layer caused by providing the blackened electrode layer, and to suppress the reduction of the visibility in a case of the conductive substrate for the touch panel, for example. For this reason, it is possible to form the conductive substrate having preferable visibility by providing the blackened electrode layer.

EXAMPLES

In the following, the present invention will be explained in further detail by examples of the present invention and comparative examples; however, the present invention is not limited by these examples.

(Evaluation Method)
(1) Regular Reflectance

In each of examples below, the regular reflectance was measured with respect to a conductive substrate fabricated in a comparative example.

A reflectance measurement unit was set to a UV-visible spectrophotometer (Model: UV-2550 manufactured by Shimadzu Corporation), and a measurement was conducted.

The laminated substrate including the configuration in FIG. 3A was prepared in each of the examples, and the reflectance was measured by illuminating light of the wavelength of 400 nm or more and 700 nm or less, with an incident angle of 5° and an acceptance angle of 5° with respect to a surface C exposed to an outside of the second blackened layer 132 in FIG. 3A. It should be noted that the wavelength of the light emitted to the laminated substrate was changed by every 1 nm within a wavelength range of 400 nm or more and 700 nm or less, the regular reflectance was measured for the light per wavelength, and an average of measurement results was regarded as an average of the regular reflectance of the conductive substrate.

(2) Undercut Amount Ratio of Metal Thin Wire

A cross section of the electrode of the conductive substrate prepared in each of the examples and the comparative examples was observed, and the undercut amount ratio was calculated by obtaining a pattern width $W_1$ of the metal thin electrode and a bottom width $W_1$ of the metal thin electrode. It should be noted that the pattern width $W_1$ of the metal thin electrode and the bottom width $W_1$ of the metal thin electrode have been already described with reference to FIG. 6.

(3) Reduction Rate of Total Light Transmittance of Opening Part

A total light transmittance was measured with respect to the opening portion between the metal thin electrodes, which exposes the transparent base material of the conductive substrate prepared in each of the examples and the comparative examples.

An integrating sphere attachment device was arranged to the UV-visible spectrophotometer used to measure the regular reflectance, and the measurement was conducted. The wavelength of the light emitted to the laminated substrate was changed by every 1 nm within the wavelength range of 400 nm or more and 700 nm or less, the regular reflectance was measured for the light per wavelength, and the average of measurement results was regarded as the average of the regular reflectance of the conductive substrate.

Moreover, an average of the total light transmittance was measured in the same manner with respect to the transparent base material used when the laminated substrate was fabricated beforehand.

Then, a reduction rate of an average of the total light transmittance of the opening portion of the conductive substrate prepared in each of the examples and the comparative examples from an average of the total light transmittance of the transparent base material was calculated.

(Conditions for Preparing Samples)

The laminated substrate and the conductive substrate were prepared with conditions described below as each of the examples and the comparative examples, and were evaluated by the above described evaluation method.

Example 1

The laminated substrate including the configuration depicted in FIG. 3A was prepared.

First, the transparent base material preparation process was carried out.

In particular, a transparent base material made of optical polyethylene terephthalate resin (PET) having a width of 500 mm and a thickness of 100 μm was prepared.

Next, the laminated body formation process was carried out.

As the laminated body formation process, a first blackened layer formation step, a copper layer formation step, and a second blackened layer formation step were carried out. In the following, details will be described.

First, the first blackened layer formation step were carried out.

The prepared transparent base material was set to roll-to-roll sputtering apparatus 70 illustrated in FIG. 7. Moreover, a copper-11 mass % Ni alloy target (manufactured by Sumitomo Metal Mining Co., Ltd.) was attached to the sputtering cathodes 74a through 74d.

Next, a heater 79 of the roll-to-roll sputtering apparatus 70 was heated to 100° C., and the transparent base material was heated to remove moisture contained in the transparent base material.

Subsequently, after evacuating the inside of the chassis 71 to $1 \times 10^{-4}$ Pa with the vacuum pumps 70a and 70b, the argon gas and the oxygen gas were introduced into the chassis 71 so that the flow rate of the argon gas was 240 sccm and the flow rate of the oxygen gas was 40 sccm. While conveying the transparent base material from the winding roll 72 at a speed of 2 m/min, electric power was supplied from the sputtering direct current power supply connected to the sputtering cathodes 74a through 74d, and a sputtering discharge was performed to successively form a desired first blackened layer on the transparent base material. By this operation, the first blackened layer 131 was formed on the transparent base material so as to have a thickness of 20 nm.

Subsequently, the copper layer formation step was performed.

In the copper layer formation step, a target to be attached to the sputtering cathode was changed to a copper target (manufactured by Sumitomo Metal Mining Co., Ltd.), and after evacuating the interior of the chassis, the argon gas alone was introduced in the chassis 71 of the roll-to-roll sputtering apparatus 70. Other than this operation, the copper layer was formed on the upper surface of the first blackened layer to have a thickness of 200 nm similarly to the case of the first blackened layer.

It should be noted that as a base material to form the copper layer, in the first blackened layer formation process, a base material used to form the first blackened layer on the transparent base material.

Next, the second blackened layer formation step is carried out.

In the second blackened layer formation step, the second blackened layer 132 is formed on a top surface of the copper layer 12 in the same condition as the first blackened layer 131 (refer to FIG. 3A).

The average of the regular reflectance of light having the wavelength of 400 nm or more and 700 nm or less of the prepared laminated substrate was measured in accordance with the above described procedure, and the average of the regular reflectance of light having the wavelength of 400 nm or more and 700 nm or less was 55%.

Also, after measuring the regular reflectance was measured with respect to the acquired laminated substrate, the etching process was carried out and the conductive substrate was prepared.

First, in the etching process, the resist including the opening portion corresponding to the portion to be eliminated by the etching was formed on the surface C of the prepared laminated substrate in FIG. 3A. Then, the prepared laminated substrate was immersed in an etchant containing 10% by weight of ferric chloride, 10% by weight of hydrochloric acid and the balance of water for 1 minute to prepare the conductive substrate.

With respect to the prepared conductive substrate, the undercut amount ratio of the metal thin electrode and the total light transmittance of the opening portion were measured.

Evaluation results are shown in Table 1.

Example 2 Through Example 7

Each of the laminated substrates was prepared and evaluated in the same manner as in Example 1 except that compositions of the sputtering targets and the supply amount of oxygen used for forming the first and second blackened layers were changed as shown in Table 1.

Moreover, the conductive substrate was prepared similarly to Example 1 from the prepared laminated substrate, and was evaluated.

Results are shown in Table 1.

Comparative Example 1, Comparative Example 2

Each of the laminated substrates was prepared in the in the same manner as in Example 1 except that the compositions of the sputtering targets used for forming the first and second blackened layers were changed as shown in Table 1, and was evaluated.

Moreover, the conductive substrate was prepared similarly to Example 1 from the prepared laminated substrate, and was evaluated.

Results are shown in Table 1.

TABLE 1

| | Formation Condition of Blackened Layer | | | Evaluation Results | | |
|---|---|---|---|---|---|---|
| | O$_2$ Supply Flow Rate during Layer Blackened layer Formation | Compositions of Sputtering Target | | Regular Reflectance [%] | Undercut Amount Ratio of Metal Thin Wire | Reduction rate [%] of Total Light Transmittance of Opening Portion |
| | | Ni [wt %] | Cu [wt %] | | | |
| Example 1 | 40 | 11 | bal. | 55 | 0.05 | 0.6 |
| Example 2 | 50 | 11 | bal. | 24 | 0.06 | 0.7 |
| Example 3 | 40 | 20 | bal. | 48 | 0.04 | 1.0 |
| Example 4 | 40 | 30 | bal. | 40 | 0.03 | 1.4 |
| Example 5 | 40 | 40 | bal. | 29 | 0.02 | 2.1 |
| Example 6 | 40 | 50 | bal. | 21 | 0.01 | 2.5 |

TABLE 1-continued

| | Formation Condition of Blackened Layer | | | Evaluation Results | | |
|---|---|---|---|---|---|---|
| | O₂ Supply Flow Rate during Layer Blackened layer Formation | Compositions of Sputtering Target | | Regular Reflectance [%] | Undercut Amount Ratio of Metal Thin Wire | Reduction rate [%] of Total Light Transmittance of Opening Portion |
| | | Ni [wt %] | Cu [wt %] | | | |
| Example 7 | 40 | 60 | bal. | 10 | — | 3.0 |
| Comparative Example 1 | 40 | 10 | bal. | 56 | 0.10 | 0.5 |
| Comparative Example 2 | 40 | 61 | bal. | 9 | — | 3.4 |

According to the results shown in Table 1, regarding Example 1 through Example 7, the undercut amount ratio of the metal thin electrode was 0.075 or less, and the reduction ratio of the total light transmittance of the opening portion was 3.0% or less. That is, the copper layer and the first and second blackened layers could be simultaneously etched.

This is considered to be due to that among copper and nickel contained in the sputtering target used to form the first and second blackened layers, the ratio of nickel was 11 mass % or more and 60 mass % or less, and the formed blackened layer had the same compositions. That is, it is thought that the reactivity of the blackening layer to the etching solution could be made equal to that of the copper layer.

It should be noted that in Example 7, the undercut was not made. That is, the undercut amount ratio was 0 or less.

With respect to this result, it was confirmed for Comparative Example 1 that the undercut amount ratio of the metal thin electrode was 0.10 and greatly exceeded 0.0.7, and the etching speed of the blackened layer was faster than the copper layer. Moreover, it was confirmed for Comparative Example 2 that the reduction ratio of the total light transmittance of the opening portion exceeded 3.0%, and the etching speed of the blackened layer was slower than the copper layer.

This is considered to be due to that among copper and nickel contained the sputtering target used to form the first and second blackened layer, the ratio of nickel was 11 mass % or less or exceeded 60 mass %, even the formed blackened layer had the similar compositions.

Although the laminated substrate, the conductive substrate, the method for fabricating the laminated substrate and the method for fabricating the conductive substrate has been described in the embodiment, the examples, and the like, the present invention is not limited to the embodiment and the examples and the like. Various modifications and changes can be made within the scope of the gist of the present invention described in the claims.

The present application is based on and claims the benefit of priority of Japanese Priority Application No. 2015-129123 filed on Jun. 26, 2015, the entire contents of which are hereby incorporated by reference.

DESCRIPTION OF THE REFERENCE NUMERALS 10A, 10B, 20A, 20B laminated substrate
11 transparent base material
12, 12A, 12B copper layer
13, 13A, 13B, 131, 132, 131A, 131B, 132A, 132B blackened layer
30 laminated substrate
31A, 31B, 62 copper electrode layer
321A, 321B, 322A, 322B, 61 blackened electrode layer

The invention claimed is:

1. A conductive substrate, comprising:
a transparent base material; and
a metal thin electrode formed on at least one surface of the transparent base material,
wherein the metal thin electrode includes
a blackened electrode layer containing oxygen, copper, and nickel; and
a laminated body having a copper electrode layer, and
a ratio of the nickel is 11 mass % or more and 60 mass % or less among the copper and the nickel contained in the blackened electrode layer, and
wherein a bottom width ($W_2$) of the metal thin electrode and a pattern width ($W_1$) of the metal thin electrode satisfy a relationship of formula (1):

$(W_1-W_2)/2W_1 \leq 0.075$.

2. The conductive substrate as claimed in claim 1, wherein the metal thin electrode includes two layers: a first blacken electrode layer and a second blacken electrode layer, and
the copper electrode layer is deployed between the first blacken electrode layer and the second blacken electrode layer.

3. The conductive substrate as claimed in claim 1, wherein an opening portion exposing the transparent base material is provided between the metal thin electrodes, and
a reduction ratio of an average of transmittance of light having a wavelength of 400 nm or more and 700 nm or less at the opening portion from an average of transmittance of light having a wavelength of 400 nm or more and 700 nm or less at the transparent base material is 3.0% or less.

4. A method for fabricating a conductive substrate, comprising:
a transparent base material preparation process that prepares a transparent base material; and
a laminated body formation process that forms a laminated body on at least one surface of the transparent base material;
an etching process that forms an electrode pattern by etching the laminated body,
wherein the laminated body formation process includes
a copper layer formation step that forms a copper layer by a copper layer formation part that stacks copper, and
a blackened layer formation step that forms a blackened layer by a blackened layer formation part that stacks a blacked layer containing oxygen, copper, and nickel, wherein the blackened layer formation step is carried out under a reduce pressure atmosphere, and a ratio of the nickel is 11 mass % or more and 60 mass % or less among the copper and the nickel contained in the blackened layer, and wherein the etching process etches the copper layer and the blacked layer of the laminated substrate, and forms the electrode pattern including a metal thin electrode, which is a laminated body having a copper electrode layer and a blackened electrode layer, and an opening portion is formed by the etching process in the copper layer and the blackened layer, and wherein a bottom width ($W_2$) of the metal thin electrode and a pattern width ($W_1$) of the metal thin electrode satisfy a relationship of formula (1):

$$(W_1-W_2)/2W_1 \leq 0.075.$$

5. The method for fabricating a conductive substrate as claimed in claim 4, wherein the blackened layer formation part is a sputtering formation method.

6. The method for fabricating a conductive substrate as claimed in claim 4, wherein an average of a regular reflectance of light having a wavelength of 400 nm or more and 700 nm or less at the conductive substrate to be acquired is 55% or less.

* * * * *